(12) United States Patent
Yin et al.

(10) Patent No.: US 11,856,854 B2
(45) Date of Patent: Dec. 26, 2023

(54) MRAM DEVICE STRUCTURES AND METHOD OF FABRICATING THE SAME

(71) Applicant: Taiwan Semiconductor Manufacturing Company, Ltd., Hsinchu (TW)

(72) Inventors: Yu-Feng Yin, Hsinchu County (TW); Min-Kun Dai, Hsinchu (TW); Chien-Hua Huang, Miaoli County (TW); Chung-Te Lin, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 247 days.

(21) Appl. No.: 17/465,351

(22) Filed: Sep. 2, 2021

(65) Prior Publication Data
US 2022/0328758 A1 Oct. 13, 2022

Related U.S. Application Data

(60) Provisional application No. 63/172,773, filed on Apr. 9, 2021.

(51) Int. Cl.
*H10N 50/01* (2023.01)
*G11C 11/16* (2006.01)
(Continued)

(52) U.S. Cl.
CPC .......... *H10N 50/01* (2023.02); *G11C 11/161* (2013.01); *H01L 21/7684* (2013.01);
(Continued)

(58) Field of Classification Search
CPC ........ H10N 50/01; H10N 50/80; H10N 50/85; G11C 11/161; H01L 21/76832;
(Continued)

(56) References Cited

U.S. PATENT DOCUMENTS

| 6,873,535 B1 | 3/2005 | Wang et al. |
| 6,946,698 B1 | 9/2005 | Lin |

(Continued)

OTHER PUBLICATIONS

Shen, Hsiang-Ku et al., "Semiconductor Memory Device and Method of Forming the Same", U.S. Appl. No. 16/998,911, filed Aug. 20, 2020, Assignee: Taiwan Semiconductor Manufacturing Co., Ltd., 22 pages specification, 20 pages drawings.

(Continued)

*Primary Examiner* — Caleb E Henry
(74) *Attorney, Agent, or Firm* — HAYNES AND BOONE, LLP

(57) ABSTRACT

Semiconductor structure and methods of forming the same are provided. An exemplary method includes receiving a workpiece including a magnetic tunneling junction (MTJ) and a conductive capping layer disposed on the MTJ, depositing a first dielectric layer over the workpiece, performing a first planarization process to the first dielectric layer, and after the performing of the first planarization process, patterning the first dielectric layer to form an opening exposing a top surface of the conductive capping layer, selectively removing the conductive capping layer. The method also includes depositing an electrode layer to fill the opening and performing a second planarization process to the workpiece such that a top surface of the electrode layer and a top surface of the first dielectric layer are coplanar.

20 Claims, 15 Drawing Sheets

(51) Int. Cl.
*H01L 23/522* (2006.01)
*H01L 21/768* (2006.01)
*H10B 61/00* (2023.01)
*H10N 50/80* (2023.01)
*H10N 50/85* (2023.01)

(52) U.S. Cl.
CPC .. *H01L 21/76832* (2013.01); *H01L 21/76879* (2013.01); *H01L 23/5226* (2013.01); *H10B 61/00* (2023.02); *H10N 50/80* (2023.02); *H10N 50/85* (2023.02)

(58) Field of Classification Search
CPC .......... H01L 21/7684; H01L 21/76879; H01L 23/5226; H10B 61/00
See application file for complete search history.

(56) References Cited

U.S. PATENT DOCUMENTS

| | | | |
|---|---|---|---|
| 7,099,176 B2 | 8/2006 | Tang et al. | |
| 7,170,775 B2 | 1/2007 | Tang et al. | |
| 9,875,929 B1* | 1/2018 | Shukla | H01L 29/40117 |
| 9,972,775 B2* | 5/2018 | Shum | H10N 50/10 |
| 10,141,221 B1* | 11/2018 | Lai | H01L 21/76831 |
| 10,217,746 B1* | 2/2019 | Kim | H10B 43/35 |
| 10,270,025 B2 | 4/2019 | Chuang et al. | |
| 10,290,648 B1* | 5/2019 | Zhou | H10B 43/27 |
| 10,580,966 B1* | 3/2020 | van der Straten | H10B 61/00 |
| 2001/0010938 A1* | 8/2001 | Bronner | H10B 61/10 |
| | | | 257/E27.005 |
| 2011/0062536 A1* | 3/2011 | Min | H10B 61/22 |
| | | | 257/E29.323 |
| 2016/0181509 A1* | 6/2016 | Shin | H10B 61/22 |
| | | | 438/3 |
| 2016/0351797 A1* | 12/2016 | Yi | H10N 50/01 |
| 2016/0365352 A1* | 12/2016 | Nishikawa | H01L 23/5226 |
| 2017/0053906 A1* | 2/2017 | Or-Bach | H10B 12/20 |
| 2017/0110649 A1* | 4/2017 | Diaz | H01L 21/302 |
| 2017/0162597 A1* | 6/2017 | Sharangpani | H01L 29/40117 |
| 2018/0342557 A1* | 11/2018 | Mori | H10N 70/823 |
| 2019/0259941 A1* | 8/2019 | Yang | B82Y 25/00 |
| 2020/0013826 A1* | 1/2020 | Reznicek | H10N 52/101 |
| 2020/0035907 A1* | 1/2020 | Peng | H10N 50/01 |
| 2020/0051904 A1* | 2/2020 | Tang | H10B 43/27 |
| 2020/0098978 A1 | 3/2020 | Liao | |
| 2020/0251652 A1* | 8/2020 | Hashemi | H10N 50/80 |
| 2020/0350203 A1* | 11/2020 | Fratin | G11C 5/025 |
| 2020/0388650 A1* | 12/2020 | Nardi | H10N 70/8613 |
| 2020/0388757 A1* | 12/2020 | Yang | H10N 70/826 |
| 2020/0395407 A1* | 12/2020 | Takahashi | H10N 70/066 |
| 2020/0395412 A1* | 12/2020 | Takahashi | H10B 63/845 |
| 2020/0402988 A1* | 12/2020 | Howder | H10B 41/27 |
| 2020/0403033 A1* | 12/2020 | Lilak | H10B 43/50 |
| 2021/0028107 A1* | 1/2021 | Yang | H10N 70/20 |
| 2021/0082751 A1* | 3/2021 | Yang | H01L 23/5226 |
| 2021/0091300 A1* | 3/2021 | Doris | H10N 50/10 |

OTHER PUBLICATIONS

Yin, Yu-Feng et al., "Semiconductor Device and Manufacturing Method Thereof", U.S. Appl. No. 17/008,000, filed Aug. 31, 2020, Assignee: Taiwan Semiconductor Manufacturing Company, Ltd., Specification and Drawings, 49 pages.

Yin, Yu-Feng et al., "Low-Resistance Contact to Top Electrodes for Memory Cells and Methods for Forming the Same", U.S. Appl. No. 17/199,626, filed Mar. 12, 2021, Assignee: Taiwan Semiconductor Manufacturing Company Limited, Specification and Drawings, 78 pages.

Yin, Yu-Feng et al., "Top-Interconnection Metal Lines for a Memory Array Device and Methods for Forming the Same", U.S. Appl. No. 17/224,309, filed Apr. 7, 2021, Assignee: Taiwan Semiconductor Manufacturing Company Limited, Specification and Drawings, 82 pages.

Peng, Tai-Yen et al., "Magnetic Tunnel Junction Device and Method", U.S. Appl. No. 16/887,244, filed May 29, 2020, Assignee: Taiwan Semiconductor Manufacturing Co., Ltd., Specification and Drawings, 87 pages.

Huang, Chih-Fan et al., "Structure and Method for MRAM Devices With A Slot Via", U.S. Appl. No. 17/322,560, filed May 17, 2021, Assignee: Taiwan Semiconductor Manufacturing Co., Ltd., Specification and Drawings, 64 pages.

* cited by examiner

MRAM DEVICE STRUCTURES AND METHOD OF FABRICATING THE SAME

PRIORITY

This application claims the priority to U.S. Provisional Application Ser. No. 63/172,773, filed on Apr. 9, 2021, entitled "Structure and Method for MRAM Devices," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Electronic devices contain volatile or non-volatile electronic memory to store data. Volatile memory stores data when it is powered, while non-volatile memory is able to retain stored data when power is removed. Magneto-resistive random-access memory (MRAM) is one promising candidate for a next generation non-volatile memory technology. MRAM devices may be embedded in an interconnect structure disposed over a device substrate and are controlled by driving transistors on the device substrate. While existing MRAM structures and methods for forming MRAM structures are generally adequate for their intended purposes, they are not satisfactory in all aspects.

BRIEF DESCRIPTION OF THE DRAWINGS

The present disclosure is best understood from the following detailed description when read with the accompanying figure. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
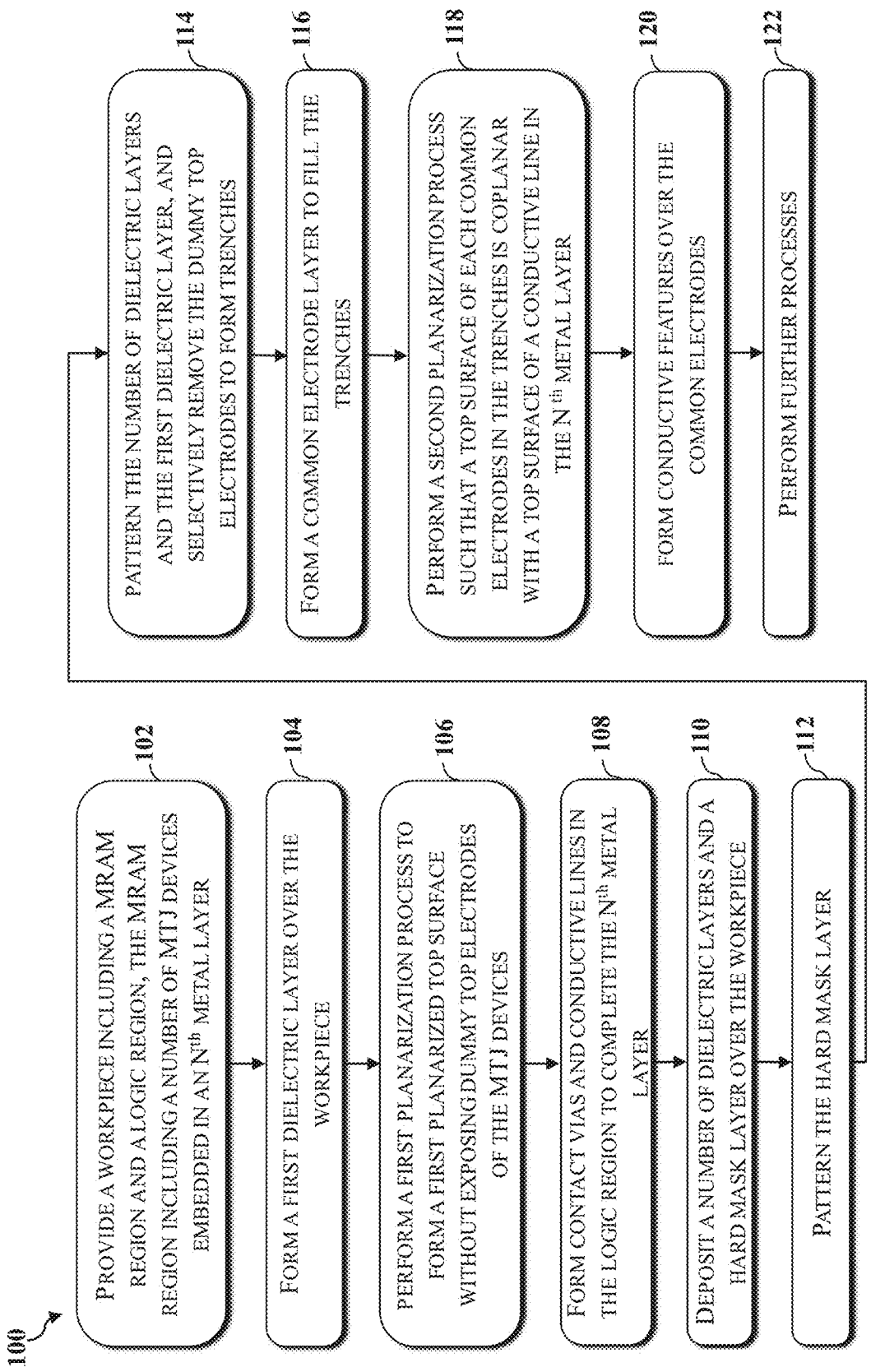
FIG. 1 illustrates a flowchart of an exemplary method for fabricating a semiconductor structure, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

IC manufacturing process flow may be typically divided into three categories: front-end-of-line (FEOL) processes, middle-end-of-line (MEOL) processes, and back-end-of-line (BEOL) processes. FEOL processes generally encompass processes related to fabricating active IC devices, such as transistors. For example, FEOL processes may include forming isolation features, gate structures, and source/drain features. MEOL processes generally encompass processes related to fabricating contacts to features of the IC devices, such as contacts to the gate structures and/or the source/drain features. BEOL processes generally encompass processes related to fabricating an interconnect structure that interconnects IC features fabricated at the FEOL level by way of contact formed at the MEOL level. Features fabricated by FEOL processes may be referred to as FEOL features. Features fabricated by MEOL processes may be referred to as MEOL features. Features fabricated by BEOL processes may be referred to as BEOL features. In some embodiments, MRAM cells of MRAM devices are fabricated at the BEOL level and may be embedded in the interconnect structure.

MRAM devices may include multiple MRAM cells. Each MRAM cell may include a magnetic tunnel junction (MTJ) device and a driving transistor configured to control the MTJ device. The MTJ device may be embedded in an interconnect structure disposed over a device substrate. The MTJ device may include an MTJ vertically arranged between a top electrode over the MTJ and a bottom electrode below the MTJ. The MTJ includes a pinned layer separated from a free layer by a tunnel barrier layer and may digitally stores data. The magnetic orientation of the pinned layer is static (i.e., fixed), while the magnetic orientation of the free layer is capable of switching between a parallel configuration and an anti-parallel configuration with respect to that of the pinned magnetic layer. The parallel configuration provides for a low resistance state that digitally stores data as a first bit value (e.g., a logical "0"). The anti-parallel configuration provides for a high resistance state that digitally stores data as a second bit value (e.g., a logical "1"). The switching between the two configurations provides two magnetic states of the MTJ. The magnetic state of the MTJ is set by application of a write current of appropriate amplitude and polarity or read out by application of a read current to apply a voltage to a sense circuit. Depending on the resistance states of the MTJ, the voltage may be higher or lower. In some implementations, the driving transistor includes two source/drain features and a gate structure. The top electrode of the MTJ device is coupled to a bit line (BL) and the bottom electrode of the MTJ device is coupled to one of the two source/drain features of the driving transistor. A source line (SL) is electrically coupled to the other of the two source/drain features of the driving transistor. The gate structure of the driving transistor is coupled to a word line (WL). When the word line (WL) is selected by application of an enabling voltage, the driving transistor is turned on, and the MTJ device is coupled between the bit line (BL) and the source line (SL). The bit line (BL) may also be coupled to a switching transistor. The MRAM cells in the same row may be connected to a common word line (WL), and the MRAM cells in the same column may be connected to a common bit line (BL).

In some examples, the top electrode of each of the MTJ devices is individually coupled to a bit line (BL) by way of a contact via. However, as the dimensions of the IC devices decrease, it becomes more and more challenging to perfectly align the contact vias and the top electrodes. When the contact vias and the top electrodes are misaligned, the contact resistance may increase and cause performance issues. To enlarge the process window, a common electrode may be shared by multiple MTJ devices. That is, top electrodes of multiple MTJ devices may be jointly coupled to the common electrode. As the common electrode is larger than the single top electrode, the issue associated with satisfactorily aligning contact vias with the top electrodes may be resolved. In some existing techniques, after the forming of the common electrode, photolithography processes may be performed to remove excessive materials over the logic region. Additionally, because the common electrode raises the top surface of the MRAM region, simultaneous formation of contact vias in the MRAM region and the logic region may be challenging due to the uneven via penetration. As such, the existing common electrode formation processes may involve increased cost and reduced yield.

The present disclosure provides semiconductor structures and methods of fabricating the same. An exemplary method includes receiving a workpiece including a magnetic tunneling junction (MTJ) over a transistor and a dummy top electrode disposed on the MTJ, depositing a first dielectric layer over the workpiece, and performing a first planarization process to the first dielectric layer without exposing a top surface of the dummy top electrode. The method also includes patterning the first dielectric layer and removing the dummy top electrode, depositing an electrode layer to fill the opening, and performing a second planarization process such that a top surface of the electrode layer and a top surface of the first dielectric layer are coplanar. By implementing the method of the present disclosure, process of fabricating the MRAM device is advantageously simplified, resulting in reduced fabrication cost and improved yield.

The various aspects of the present disclosure will now be described in more detail with reference to the figures. FIG. 1 depicts a flowchart illustrating method 100 for forming a semiconductor structure according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the methods. Not all steps are described herein in detail for reasons of simplicity. Method 100 is described below in conjunction with FIGS. 2-15, which include fragmentary cross-sectional views of a workpiece 200 at different stages of fabrication according to embodiments of method 100. More specifically, FIGS. 2, 8, 10, 12 and 14-15 are fragmentary cross-sectional views of the workpiece 200 along the X direction, and FIGS. 3-7, 9, 11, and 13 are fragmentary cross-sectional views of the workpiece 200 along the Y direction. For avoidance of doubts, throughout the figures, the X direction is perpendicular to the Y direction and the Z direction is perpendicular to both the X direction and the Y direction. Because the workpiece 200 will be formed into a semiconductor structure upon conclusion of its fabrication process, the workpiece 200 may be referred to as a semiconductor structure 200 as the context requires. Throughout the present disclosure, like reference numerals denote like features unless otherwise excepted.

Figure 2:
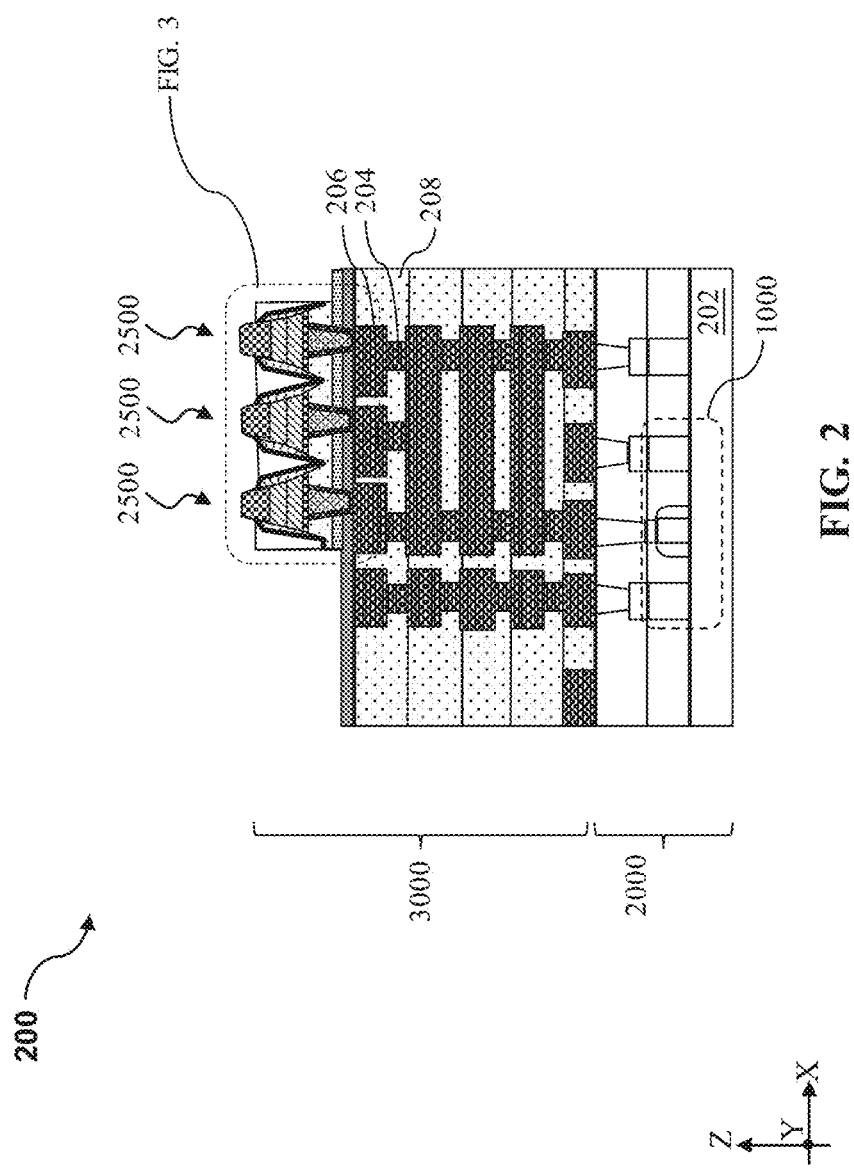
FIGS. 2-15 illustrate fragmentary cross-sectional views of an exemplary workpiece at various fabrication stages in the method of FIG. 1, according to one or more aspects of the present disclosure.
Figure 3:
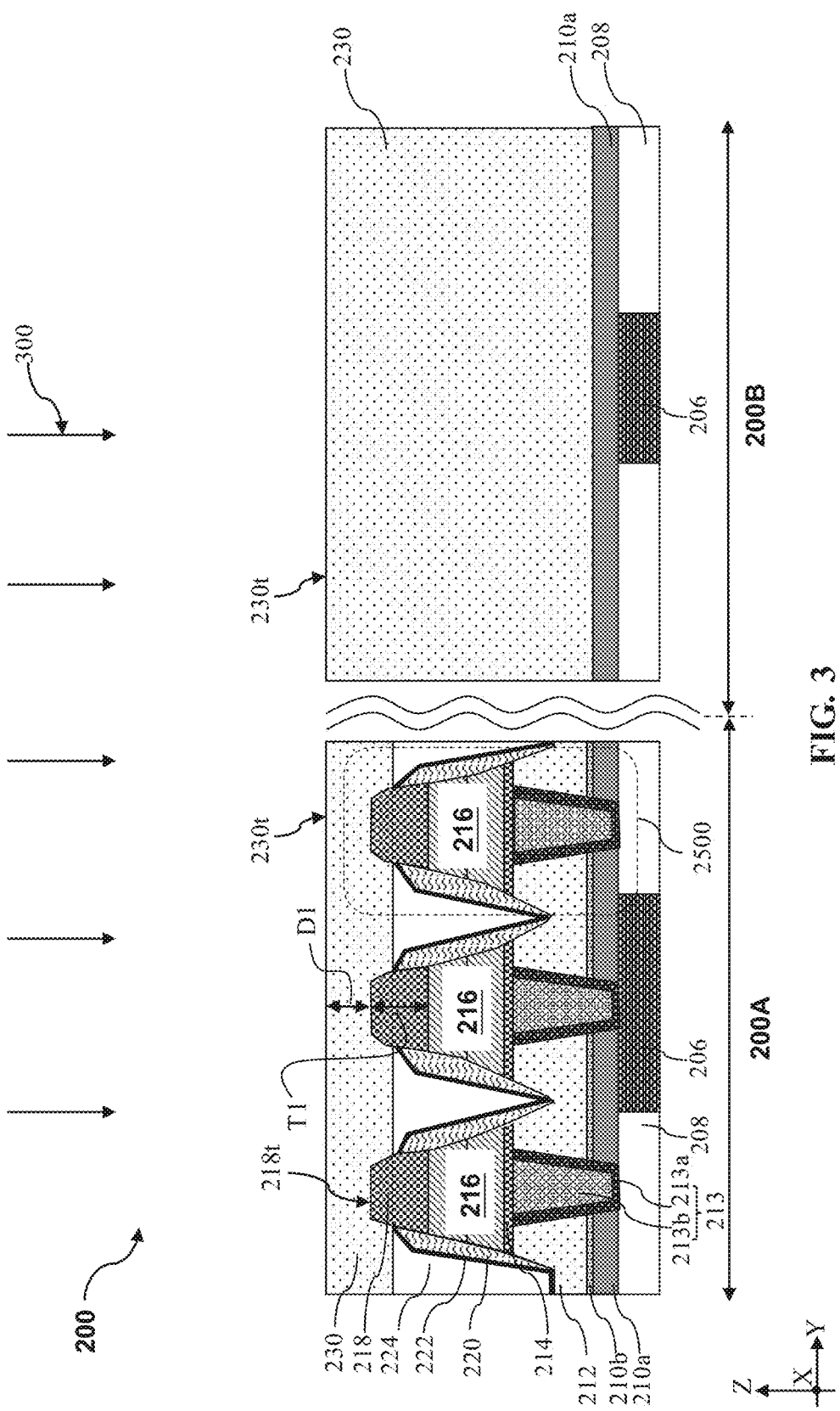

Referring to FIGS. 1, 2 and 3, method 100 includes a block 102 where a workpiece 200 is received. As shown in FIG. 2, the workpiece 200 includes a device substrate 2000 and an interconnect structure 3000 disposed over the device substrate 2000. The device substrate 2000 may include a semiconductor substrate 202, FEOL features on the semiconductor substrate 202, and MEOL features over the FEOL features. The semiconductor substrate 202 may be a silicon (Si) substrate. In some other embodiments, the semiconductor substrate 202 may include other semiconductors such as germanium (Ge), silicon germanium (SiGe), or a III-V semiconductor material. Exemplary III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The semiconductor substrate 202 may also include an insulating layer, such as a silicon oxide layer, to have a silicon-on-insulator (SOI) structure. In embodiments depicted in FIG. 2, the FEOL features include a transistor 1000 and the MEOL features include contacts such as source/drain contacts and gate contacts.

The interconnect structure 3000 shown in FIG. 2 may include N interconnect layers. For example, N may be between about 2 and about 8 interconnect layers, each of which includes contact vias 204 and conductive lines 206 embedded in an intermetal dielectric (IMD) layer 208. As will be described below, additional interconnect layers may be fabricated and the interconnect structure 3000 may include 9 or even more interconnect layers. The workpiece 200 includes a number of MTJ cells 2500 embedded in the $N^{th}$ interconnect layer, such as the $5^{th}$ or the $6^{th}$ interconnect layer. To illustrate further details of the MTJ cells 2500, the dotted area in FIG. 2 is enlarged and shown in FIG. 3. It is noticed that, FIG. 2 is a cross-sectional view of the workpiece 200 along the X direction, and FIG. 3 is a cross-sectional view of the workpiece 200 along the Y direction.

As shown in FIG. 3, the workpiece 200 includes a MRAM region 200A and a logic region 200B. The MTJ cells 2500 are provided in the MRAM region 200A and disposed over the lower IMD layer 208, while logic devices are provided in a logic region 200B. The logic devices may be used for implementing write/read logic for accessing the MTJ cells 2500 or performing other functions. Each of the MTJ cells 2500 includes a bottom electrode 214, an MTJ 216 over the bottom electrode 214, and a dummy top electrode 218 disposed over the MTJ 216. Each of the bottom electrodes 214 is coupled to a bottom contact via 213 that extends through a bottom dielectric layer 212, a first etch stop layer 210a formed on the lower IMD layer 208, and a second etch stop layer 210b formed on the first etch stop layer 210a. In some embodiments, the bottom contact via 213 includes a barrier layer 213a and a conductive filler layer 213b over the barrier layer 213a. For passivation purposes, sidewalls of the dummy top electrodes 218, the MTJs 216 and the bottom electrodes 214 are lined by a first passivation layer 220 and a second passivation layer 222. A fill dielectric layer 224 is disposed over and between the MTJ cells 2500. The dummy top electrode 218 has a top portion protruding from a top surface of the fill dielectric layer 224 and a bottom portion under the top portion. In other words, a top surface 218t of the dummy top electrode 218 is above the top surface of the fill dielectric layer 224. In an embodiment, a thickness T1 (along the Z direction) of the dummy top electrode 218 is between about 20 nm and about 40 nm.

In some embodiments, the lower IMD layer 208 and the bottom dielectric layer 212 may be formed of tetraethylorthosilicate (TEOS) oxide, un-doped silicate glass (USG), or doped silicon oxide such as borophosphosilicate glass (BPSG), fused silica glass (FSG), phosphosilicate glass (PSG), boron doped silica glass (BSG), and/or other suitable dielectric materials, and may be deposited using spin-on coating or flowable chemical vapor deposition (FCVD). The barrier layer 213a may include titanium, titanium nitride, tantalum, or tantalum nitride. The conductive lines 206 and the conductive filler layer 213b may be formed of copper (Cu), cobalt (Co), tungsten (W), titanium nitride (TiN), or nickel (Ni) and may be formed using physical vapor deposition (PVD), metalorganic CVD (MOCVD), or a suitable method. In some embodiments, the bottom electrode 214 and the dummy top electrode 218 may be formed of titanium nitride (TiN), copper (Cu), tungsten (W), or nickel (Ni). In an embodiment, the dummy top electrode 218 is formed of titanium nitride. While not explicitly shown in FIG. 3, the MTJ 216 includes a pinned layer, a tunnel barrier layer over the pinned layer, and a free layer disposed over the tunnel barrier layer. In some embodiments, the pinned layer may include cobalt (Co), iron (Fe), boron (B), ruthenium (Ru), or the like. The tunnel barrier layer may include magnesium oxide, aluminum oxide ($Al_2O_3$), or the like. The free layer may include cobalt (Co), iron (Fe), boron (B), or the like. The first etch stop layer 210a may include dielectric materials such as silicon nitride, silicon carbonitride, and the second etch stop layer 210b may be more etch resistant than the first etch stop layer 210a. For example, the second etch stop layer 210b may include aluminum oxide, zirconium oxide, and/or hafnium oxide, or other suitable materials. In some instances, the first passivation layer 220 includes materials such as silicon nitride or silicon carbonitride and the second passivation layer 222 includes materials such as aluminum oxide, zirconium oxide, and/or hafnium oxide, or other suitable materials. The fill dielectric layer 224 may include silicon oxide and may be deposited using ALD to fill in crevices between MTJ cells 2500.

Still referring to FIGS. 1 and 3, method 100 includes a block 104 where a first dielectric layer 230 is formed over the workpiece 200 and in both the MRAM region 200A and the logic region 200B. The first dielectric layer 230 fills the logic region 200B and extends above the structures in the MRAM region 200A. The first dielectric layer 230 is sufficiently thick such that its top surface in both the MRAM region 100A and the logic region 100B is higher than the top surfaces 218t of the dummy top electrodes 218 of the MTJs 216. That is, the top surfaces 218t of the dummy top electrodes 218 are covered by the first dielectric layer 230. In some embodiments, the first dielectric layer 230 may be formed of tetraethylorthosilicate (TEOS) oxide, un-doped silicate glass (USG), or doped silicon oxide such as borophosphosilicate glass (BPSG), fused silica glass (FSG), phosphosilicate glass (PSG), boron doped silica glass (BSG), and/or other suitable dielectric materials, and may be deposited using spin-on coating, flowable chemical vapor deposition (FCVD), or other suitable deposition processes. In some embodiments, the fill dielectric layer 224, the bottom dielectric layer 212, and the first dielectric layer 230 may be formed of a same material.

Still referring to FIGS. 1 and 3, method 100 includes a block 106 where a first planarization process 300 is performed to reduce the thickness of the first dielectric layer 230 to a desired range for subsequent processing. The first planarization process 300 may include a chemical mechanical polishing (CMP) process or other suitable processes. In the present embodiment, a timer (rather than using an end-point detection) may be used to help control how much of the first dielectric layer 230 is removed by the first planarization process 300. After the first planarization process 300, the first dielectric layer 230 includes a planar top surface 230t that extends across the entire surface of the workpiece 200 (including both in the MRAM region 200A and the logic region 200B). The planar top surface 230t does not expose the top surfaces 218t of the dummy top electrodes 218. That is, the first planarization process 300 stops before reaching the top surfaces 218t of the dummy top electrodes 218. In some embodiments, a distance D1 between the planar top surface 230t and the top surface 218t may be between about 5 nm and about 15 nm to facilitate the removal of the dummy top electrodes 218 and to provide an enough margin for the performing of subsequent processes such as the second planarization process 400.

Figure 4:
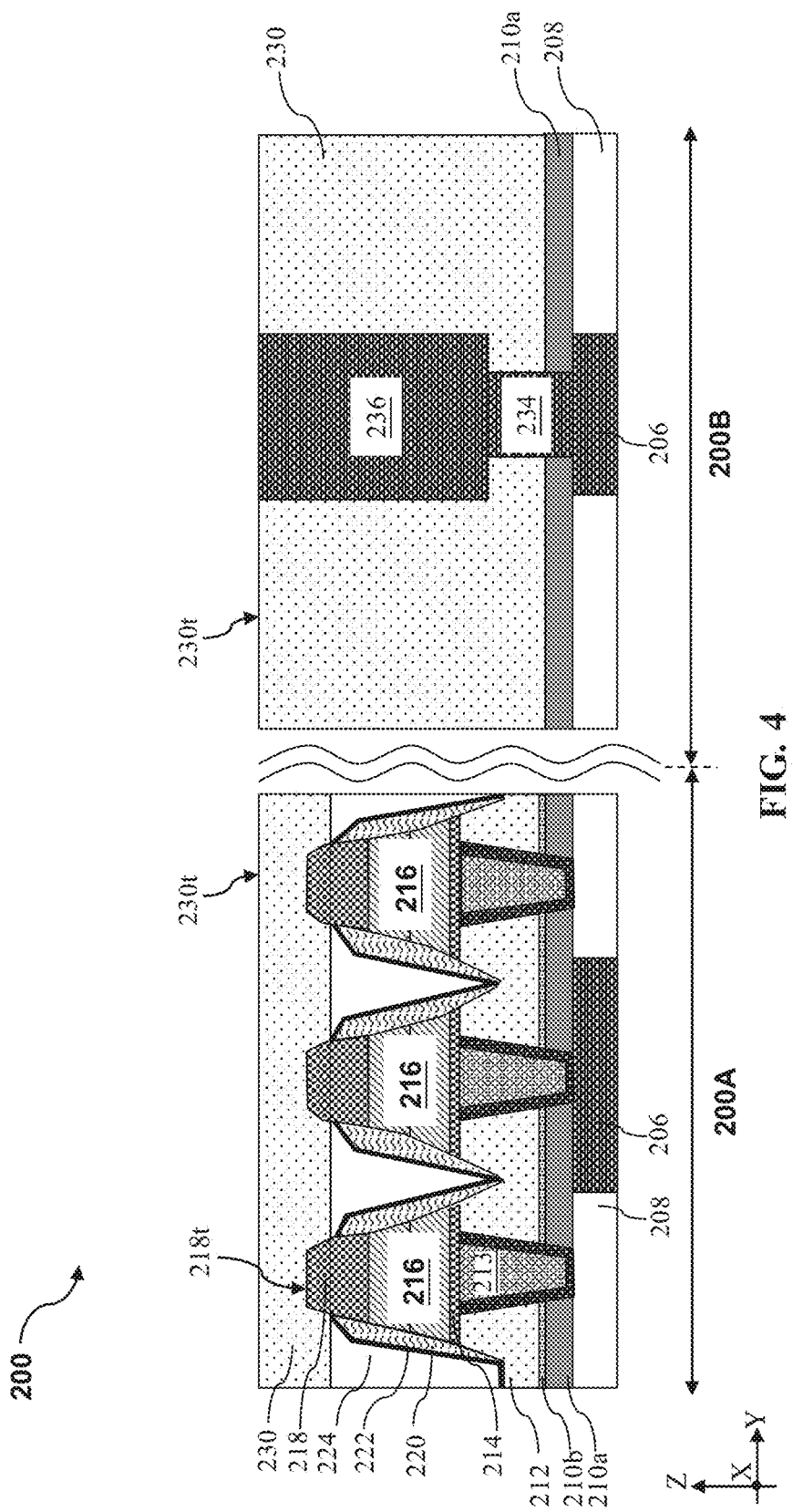

Referring to FIGS. 1 and 4, method 100 includes a block 108 where contact vias 234 and conductive lines 236 are formed in the logic region 200B. The formation of the contact vias 234 and conductive lines 236 may involve multiple processes such as photolithography, etching, and/or depositing. The contact vias 234 and conductive lines 236 each may include a barrier layer (not explicitly shown) and a conductive fill layer (not explicitly shown) over the barrier layer. The barrier layer may include tantalum, tantalum nitride, titanium, titanium nitride, or other suitable conductive materials. The conductive fill layer may include copper, aluminum, or other suitable metals. As shown in FIG. 4, the contact via 234 extends through the first etch stop layer 210a and a bottom portion of the first dielectric layer 230 and electrically coupled to the conductive line 206 in the lower IMD layer 208 in the logic region 200B. In an embodiment, a height (along the Z direction) of the contact via 234 is between about 40 nm and about 70 nm such that methods for forming features over the contact via 234 would be readily integrated into existing semiconductor fabrication processes. The conductive line 236 extends through an upper portion of the first dielectric layer 230 and electrically coupled to the contact via 234. A top surface of the conductive line 236 is coplanar with the planar top surface 230t and is above the top surface 218t of the dummy top electrode 218. In an embodiment, a thickness (along the Z direction) of the conductive line 236 may be between about 50 nm and about 100 nm such that methods for forming features over the conductive line 236 would be readily integrated into existing semiconductor fabrication processes.

Figure 5:
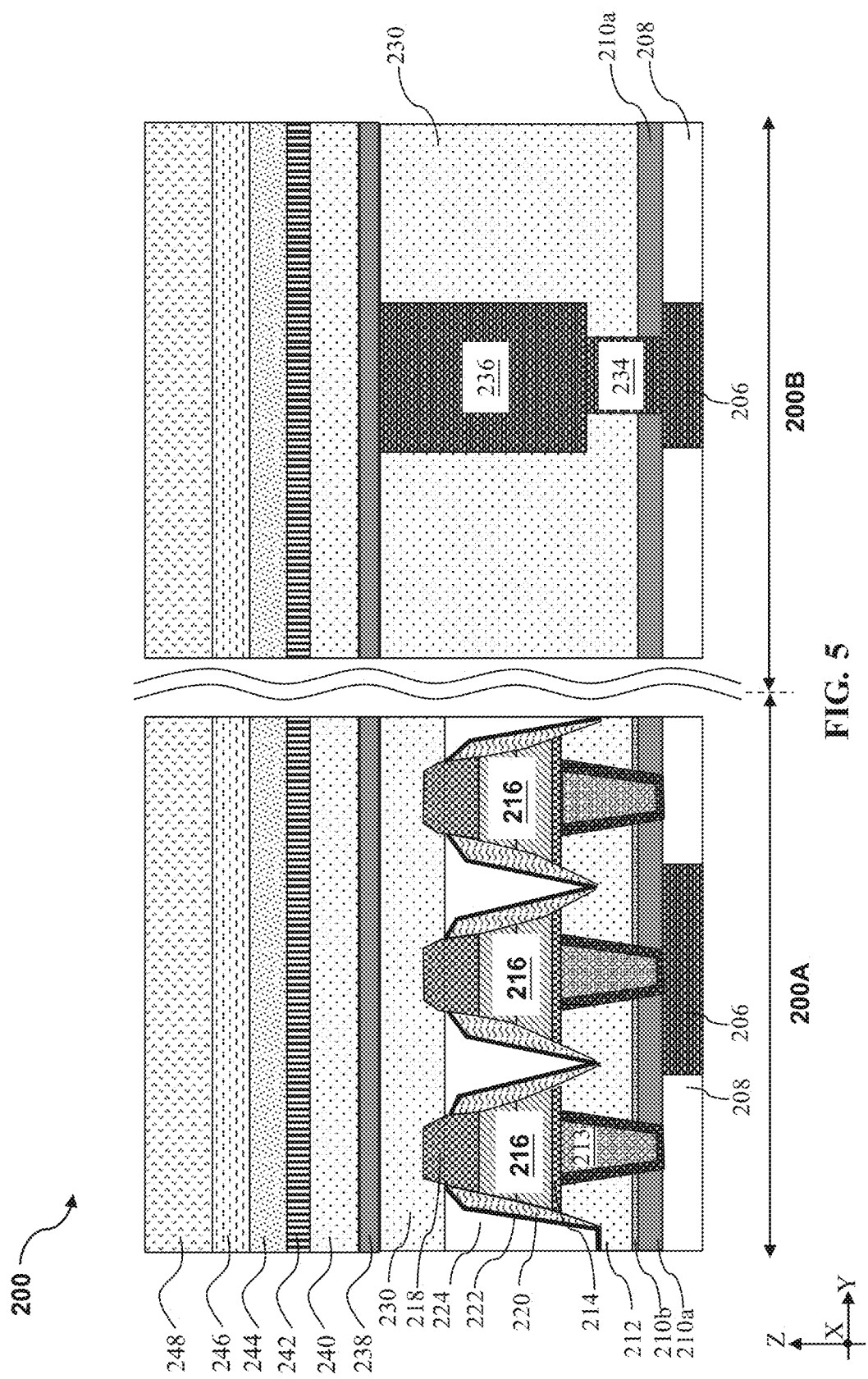

Referring to FIGS. 1 and 5, method 100 includes a block 110 where a third etch stop layer 238 and a second dielectric layer 240 are formed over the workpiece 200 and a hard mask layer 242 is formed over the second dielectric layer 240. In embodiments represented in FIG. 5, the third etch stop layer 238 is formed directly on the planar top surface 230t in both the MRAM region 200A and the logic region 200B. The third etch stop layer 238 may include one or more dielectric materials such as a nitride (for example, silicon nitride) or silicon carbide, and may be deposited using ALD, CVD, PVD, or other suitable methods. The third etch stop layer 238 may have a thickness between about 10 nm and about 15 nm to provide a satisfactory polishing duration to help indicate a polishing end point for a second planarization process 400 (to be described in detail with reference to FIG. 11).

The second dielectric layer 240 may be formed over the third etch stop layer 238 and may include un-doped silicate glass (USG), tetraethylorthosilicate (TEOS) oxide, doped silicon oxide such as borophosphosilicate glass (BPSG), fused silica glass (FSG), phosphosilicate glass (PSG), boron doped silicon glass (BSG), and/or other suitable dielectric materials, and may be deposited using CVD, PVD, or other suitable methods. In an embodiment, the second dielectric layer 240 is formed of TEOS oxide. The second dielectric layer 240 may have a thickness between about 10 nm and about 60 nm to facilitate subsequent photolithography.

The hard mask layer 242 is then formed over the second dielectric layer 240. In an embodiment, the hard mask layer 242 includes a material that has an etch selectivity with respect to the second dielectric layer 240, the third etch stop layer 238, and the first dielectric layer 230 in an etching process. For example, the hard mask layer 242 may include titanium nitride. In an embodiment, a thickness of the hard mask layer 242 is between about 20 nm and about 40 nm to provide a satisfactory protection to layers disposed under the hard mask layer 242 during the etching process. The hard mask layer 242 will be patterned in a subsequent process.

In embodiments represented in FIG. 5, the third etch stop layer 238 is a single layer structure sandwiched between the first dielectric layer 230 and the second dielectric layer 240. In some existing technologies, to form common electrodes in the MRAM region 200A, some operations may include patterning the number of layers (i.e., layers 240, 238, 230 and 239 shown in FIG. 6) to form trenches in the MRAM region 200A, removing dummy top electrodes 218, and forming common electrodes to fill the trenches. In those existing technologies, a top surface of a final structure of the common electrode is higher than a top surface of the conductive line 236 in the logic region 200B. Thus, to facilitate the formation of conductive features on the conductive line 236 in the logic region 200B, those existing technologies perform operations such as photolithography and etching (e.g., dry and/or wet etching) to selectively remove the second dielectric layer 240 in the logic region 200B without damaging the third etch stop layer 238 thereunder. To protect the third etch stop layer 238 from being substantially damaged by the etching process, a fourth etch stop layer is formed between the third etch stop layer 238 and the second dielectric layer 240. That is, the fourth etch stop layer that is more etch-resistant than the third etch stop layer 238 is used in those existing technologies. The fourth etch stop layer may include a metal oxide based dielectric material, such as aluminum oxide (e.g., $Al_2O_3$). However, by implementing the method 100 in the present disclosure, the second dielectric layer 240 and the third etch stop layer 238 would be removed by the second planarization process 400 (shown in FIG. 11). Therefore, the photolithography and etching process used to selectively remove the second dielectric layer 240 in the logic region 200B are no longer needed, this fourth etch stop layer, which is configured to protect the third etch stop layer 238, may be omitted. Accordingly, fabrication cost associated with the formation of the semiconductor structure 200 may be reduced, and residue defects that introduced by the performing of the photolithography and etching processes may be substantially eliminated, leading to an improved device performance.

Figure 6:
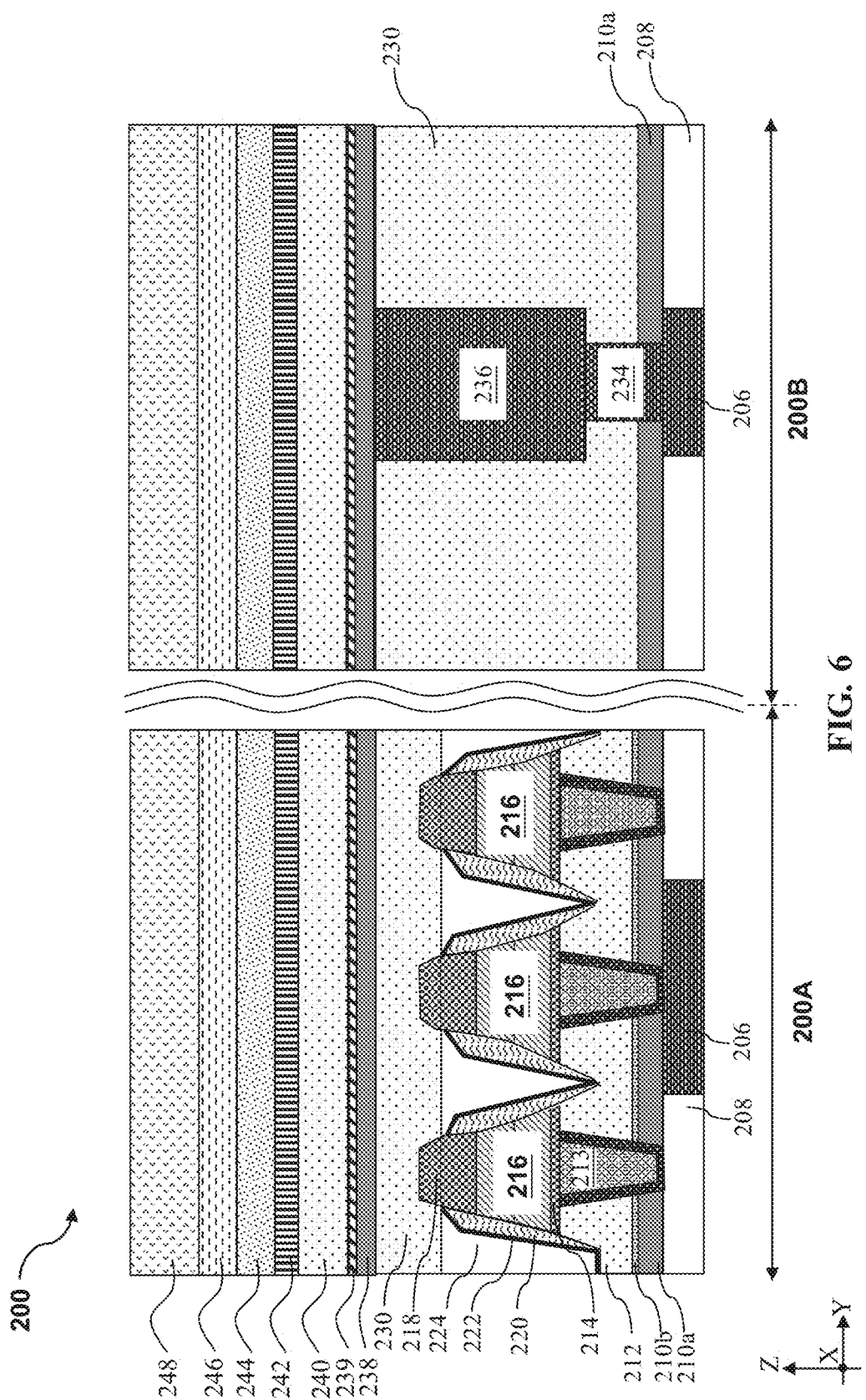

Embodiments of the present disclosure can be readily integrated into existing processes and technologies for manufacturing the semiconductor structure 200. To facilitate the integration and reduce process changes, the fourth etch stop layer may still be formed. However, as described above, the fourth etch stop layer is not necessary. FIG. 6 depicts a workpiece where the fourth etch stop layer 239 is formed directly between the third etch stop layer 238 and the second dielectric layer 240. In some embodiments, the fourth etch stop layer 239 may be deposited using ALD, CVD, PVD, or other suitable methods. The fourth etch stop layer 239 may have a thickness in a range about 4 nm to about 10 nm. It is noticed that, although the workpiece 200 includes the fourth etch stop layer 239 at this step, the advantages mentioned above such as lowering the fabrication cost and improving process yield are still tenable.

Referring to FIGS. 1 and 5, 7-8, method 100 includes a block 112 where the hard mask layer 242 is patterned. The patterning of the hard mask layer 242 may include coating a bottom layer 244, a middle layer 246, and a photoresist layer 248 over the hard mask layer 242. The bottom layer 244 may include a carbon-rich organic layer to provide a good adhesion between the hard mask layer 242 and the middle layer 246. The middle layer 246 may include a silicon-rich organic layer to provide a satisfactory patterning result. The patterning of the hard mask layer 242 may also include performing a photolithography process (such as exposing and developing) to the photoresist layer 248 to form a resist pattern. An etching process may be followed to etch the middle layer 246, the bottom layer 244, and the hard mask layer 242 while using the resist pattern as an etch mask. The photoresist layer 248, the middle layer 246 and the bottom layer 244 may be removed after forming the patterned hard mask layer (not explicitly shown).

Figure 7:
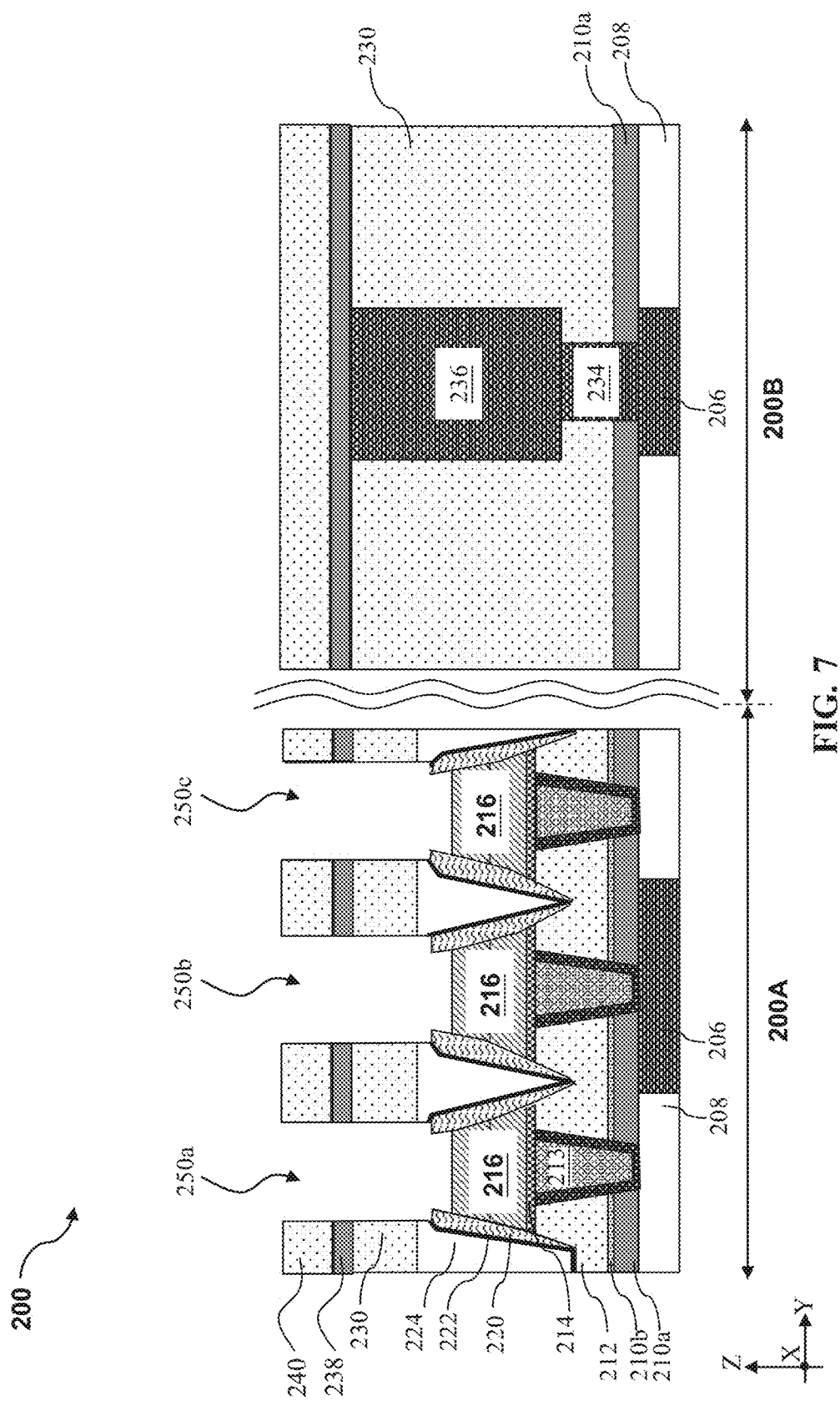
Figure 8:
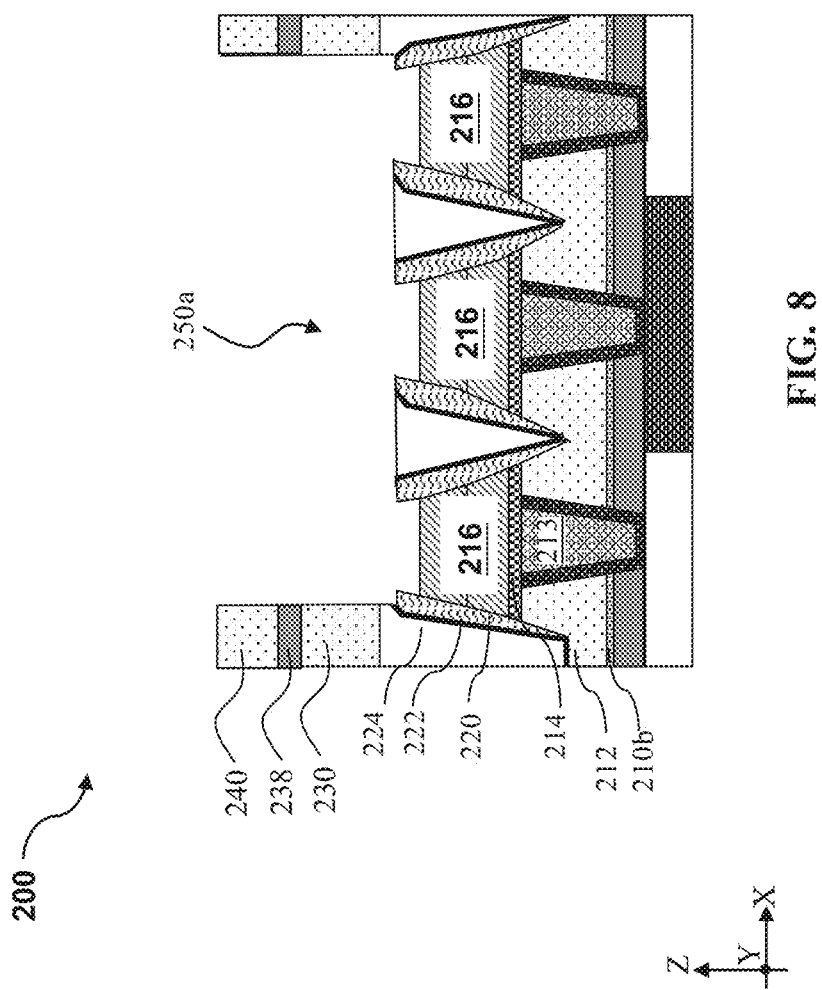

Still referring to FIGS. 1 and 7-8, method 100 includes a block 114 where the second dielectric layer 240, the third etch stop layer 238, and the first dielectric layer 230 are patterned and the dummy top electrodes 218 of the MTJ cells 2500 are selectively removed to form common electrode openings 250a, 250b, 250c. The patterned hard mask layer may be used as an etch mask during this process. Each of the common electrode openings 250a, 250b, 250c exposes top surfaces of several MTJs 216. The first passivation layer 220, the second passivation layer 222 and the fill dielectric layer 224 are also slightly etched due to operations in block 114. That is, the first passivation layer 220, the second passivation layer 222 and the fill dielectric layer 224 are also partially exposed in the common electrode openings 250a-250c.

In some embodiments, the patterning of the second dielectric layer 240, the third etch stop layer 238, and the first dielectric layer 230 and the removal of the dummy top electrodes 218 may be accomplished by a same etching process. The etching process may include an anisotropic etching process. An exemplary anisotropic etching process may include a reactive-ion-etching (RIE) process that uses an oxygen-containing gas, hydrogen, a fluorine-containing gas (e.g., $CF_4$, $NF_3$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments, the patterning of the second dielectric layer 240, the third etch stop layer 238, and the first dielectric layer 230 and the removal of the dummy top electrodes 218 may be accomplished by performing multiple etching processes. For example, a first etching process may be used for the patterning the dielectric layers 240, 238 and 230 to expose top surfaces of the dummy top electrodes 218, and a second etching process may be followed to selectively remove the dummy top electrodes 218.

It is noticed that, FIG. 7 illustrates a fragmentary cross-sectional view of the workpiece along the Y direction. FIG. 8 illustrates a fragmentary cross-sectional view of the workpiece along the X direction. Each of the common electrode openings 250a-250c exposes at least two MTJs 216 in a same column of the MTJ cells 2500. In embodiments represented in FIG. 8, the common electrode opening 250a exposes three MTJs 216 along the X direction.

Figure 9:
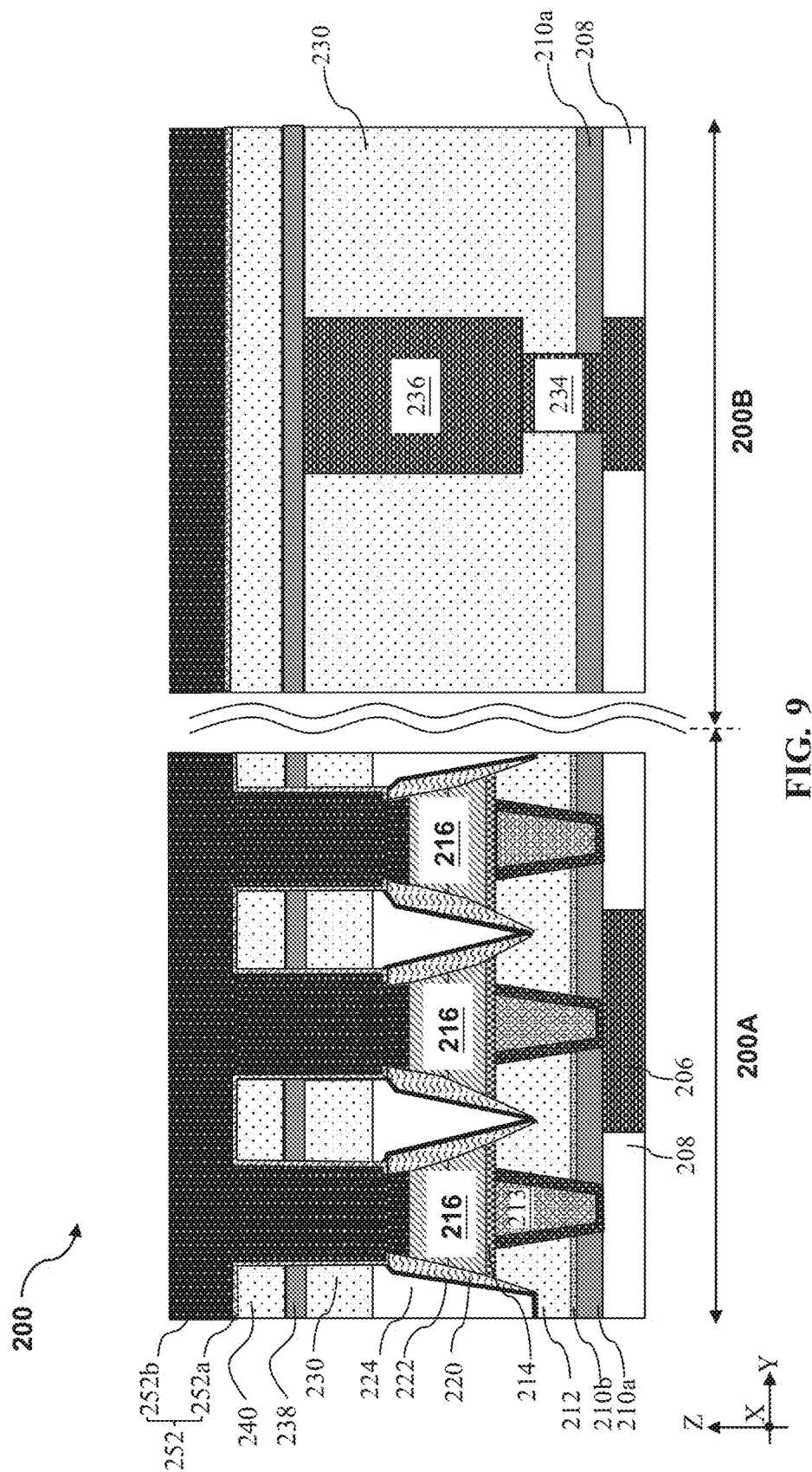
Figure 10:
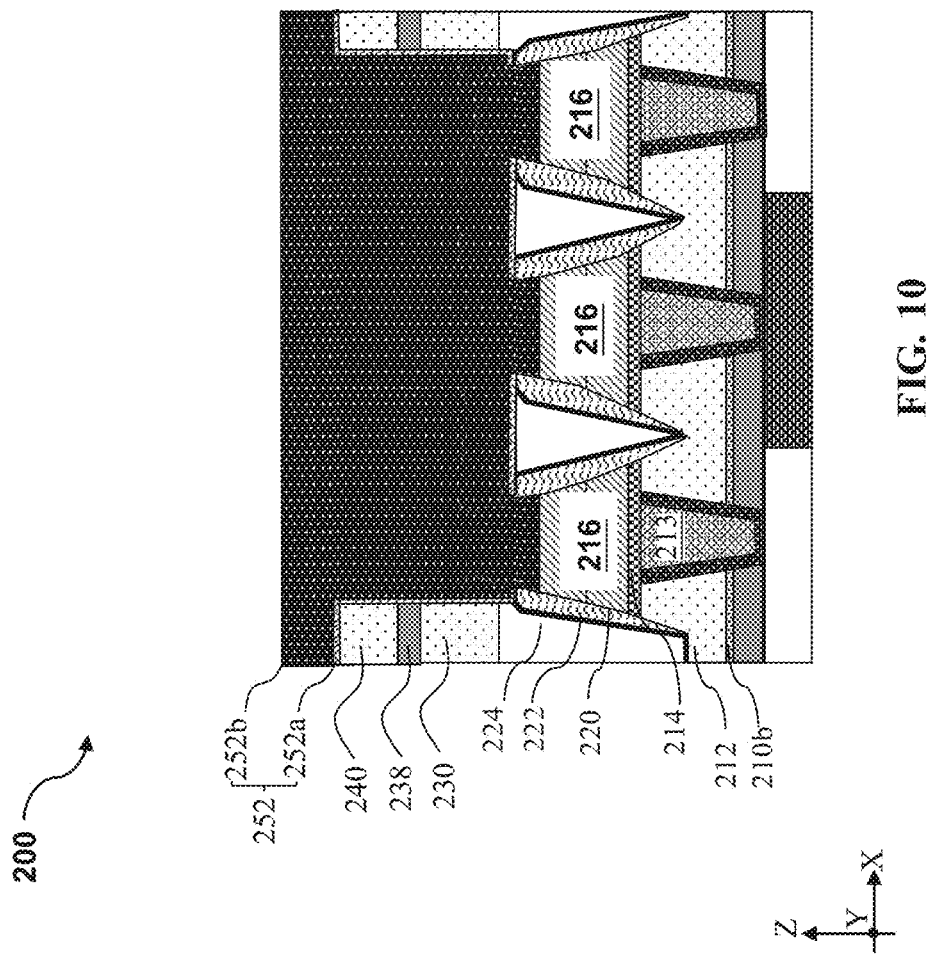

Referring to FIGS. 1 and 9-10, method 100 includes a block 116 where a common electrode layer 252 is deposited over the workpiece 200 including the MRAM region 200A and the logic region 200B to fill the common electrode openings 250a-250c. In some embodiments, the common electrode layer 252 may include tantalum (Ta), titanium nitride (TiN), tantalum nitride (TaN), aluminum (Al), tungsten (W), nickel (Ni), titanium (Ti), ruthenium (Ru), cobalt (Co), platinum (Pt), copper (Cu), other refractory metals, or other suitable materials or a combination thereof. The common electrode layer 252 is in direct contact with the MTJs 216. In embodiments represented in FIGS. 9-10, the formation of the common electrode layer 252 includes forming a barrier layer 252a conformally over the workpiece 200. The barrier layer 252a is then etched back to expose top surfaces of the MTJs 216. That is, the barrier layer 252a only extends along sidewalls of the common electrode openings 250a-250c and on the top surface of the first passivation layer 220. A metal fill layer 252b is then formed over the barrier layer 252a to fill the common electrode openings 250a-250c by ALD, PVD, CVD, e-beam evaporation, or other suitable processes. The barrier layer 252a may include tantalum, tantalum nitride, titanium, titanium nitride, or other suitable conductive materials. The metal fill layer 252b may include copper, aluminum, or other suitable metals. FIG. 10 depicts a cross-sectional view of the workpiece 200 along the X direction. As shown in FIG. 10, the common electrode layer 252 fills the common electrode opening 250a and is electrically coupled to three MTJs 216.

Figure 11:
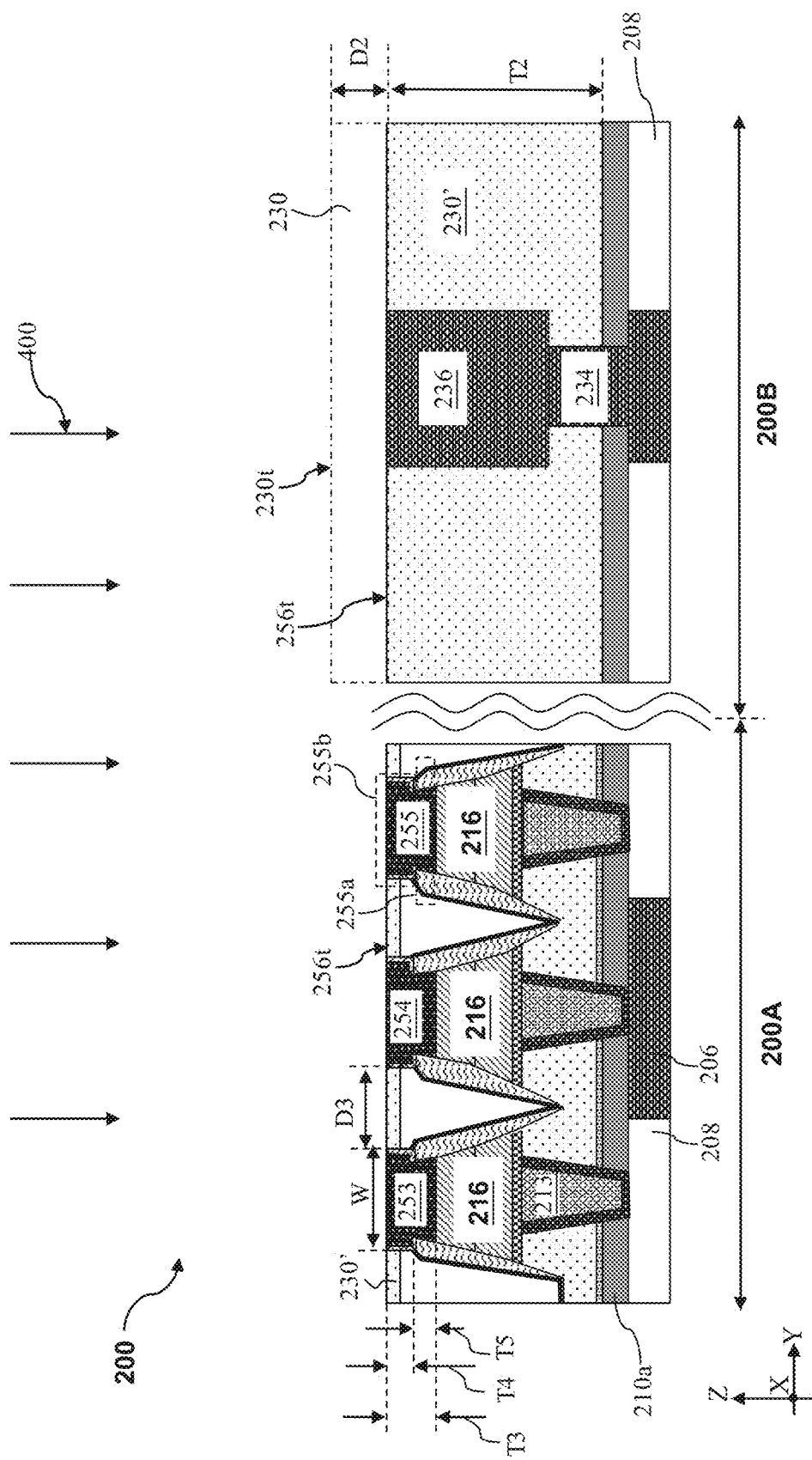
Figure 12:
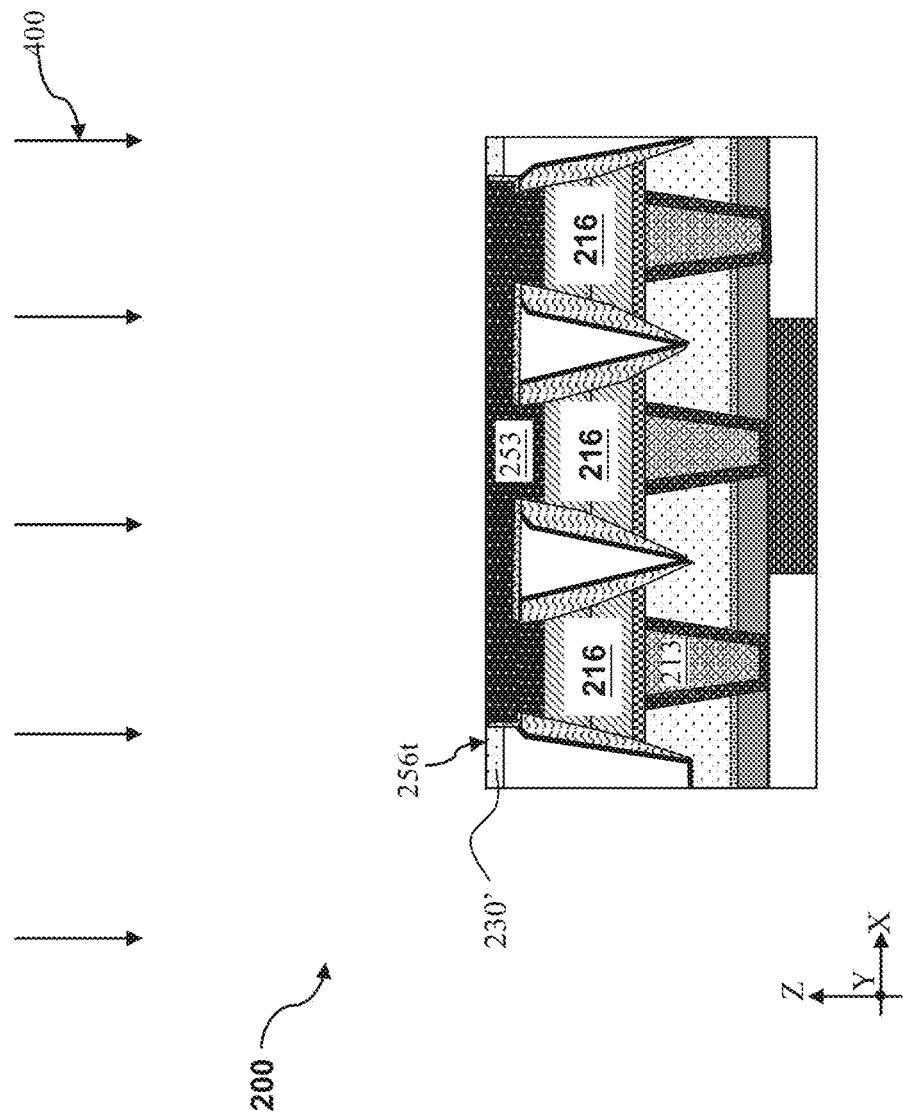

Referring to FIGS. 1 and 11-12, method 100 includes a block 118 where a second planarization process 400 is performed to remove excessive materials and form common top electrodes 253-255. After the deposition of the metal fill layer 252b, the second planarization process 400, such as a CMP process, is performed to remove excessive materials over the first dielectric layer 230. The second planarization process 400 removes the second dielectric layer 240, the third etch stop layer 238, the fourth etch stop layer 239 (if formed), and excessive common electrode layer 252 to expose a top surface of the conductive line 236 in the logic region 200B and provides a substantially planar top surface 256t extending across the MRAM region 200A and the logic region 200B. That is, there is minor or substantially no step change (height difference) between the MRAM region and the logic region 200B after the second planarization process 400. In this depicted example, a portion of the first dielectric layer 230 in the workpiece 200 and a portion of the conductive line 236 in the logic region 200B are also removed by the second planarization process 400 to define final shapes of the common top electrodes 253-255 and the conductive lines 236. In an embodiment, after the second planarization process 400, the conductive line 236 has a thickness T2 (along the Z direction) between about 50 nm and about 70 nm such that methods for forming features over the contact line 236 would be readily integrated into existing semiconductor fabrication processes.

The third etch stop layer 238 may serve as a CMP stop layer to help control an end point of the second planarization process 400. For example, the second planarization process 400 polishes the third etch stop layer 238 at a rate different than a rate of polishing the first dielectric layer 230. After detecting a polishing rate change which indicates the third etch stop layer 238 is removed, the second planarization process 400 may continue for another period of time to remove an excessive portion of the first dielectric layer 230 and define the final shapes of the common top electrodes 253-255 and the conductive lines 236. In some embodiments, considering a thickness T2 of the conductive line 236 in the final structure, the excessive portion of the first dielectric layer 230 removed by the second planarization process 400 may have a thickness between about 10 nm and about 30 nm. That is, a distance D2 between the planar top surface 230t and the planar top surface 256t is between about 10 nm and about 30 nm. In some embodiments, the distance D2 is greater than a thickness of the third etch stop layer 238. The rest of first dielectric layer 230 after the implementation of the second planarization process 400 may be also referred to as first dielectric layer 230'.

Upon conclusion of the second planarization process 400, the planar top surface 256t of the workpiece 200 exposes top surfaces of the common top electrodes 253-255, a top surface of the first dielectric layer 230', and a top surface of the conductive line 236. In other words, top surfaces of the common top electrodes 253-255 are coplanar with the top surface of the first dielectric layer 230' and are also coplanar with the top surface of the conductive line 236 in the logic region 200B. Each of the common top electrodes 253-255 may have a thickness T3 between about 10 nm and about 30 nm to provide a satisfactory resistance. The common top electrodes 253-255 each includes a bottom portion 255a in direct contact with the MTJ 216 and the first passivation layer 220 and an upper portion 255b disposed over the first passivation layer 220 and embedded in the fill dielectric layer 224 and the first dielectric layer 230'. The upper portion 255b has a thickness T4 along the Z direction and the bottom portion 255a has a thickness T5 along the direction. In some embodiments, given the satisfactory thickness T2 of the conductive lines in the logic region 200B, a ratio of T4 to T5 (i.e., T4/T5) may be between about 1 and about 4 such that a final structure of the workpiece 200 would have a satisfactory resistance. In an embodiment, the ratio of T4 to T5 is between about 2 and about 3 to provide the satisfactory resistance while considering the dimensions of the dummy top electrodes 218 and the etching process used to remove the dummy top electrodes 218. In some embodiments, T4 may be between about 8 nm and about 20 nm, and T5 may be between about 2 nm and about 10 nm to such that each of the common top electrodes 253-255 would have satisfaction thickness and resistance. A spacing D3 between two adjacent common top electrodes (e.g., 253 and 254) may be between about 20 nm and about 30 nm such that the MTJ cells 2500 would be readily integrated into existing semiconductor fabrication processes. In embodiments represented in FIG. 12, in the X direction, after the second planarization process 400, the MTJs 216 exposed by a same common electrode opening (e.g., opening 250a) are still electrically connected by a common top electrode (e.g., the common top electrode 253).

Figure 13:
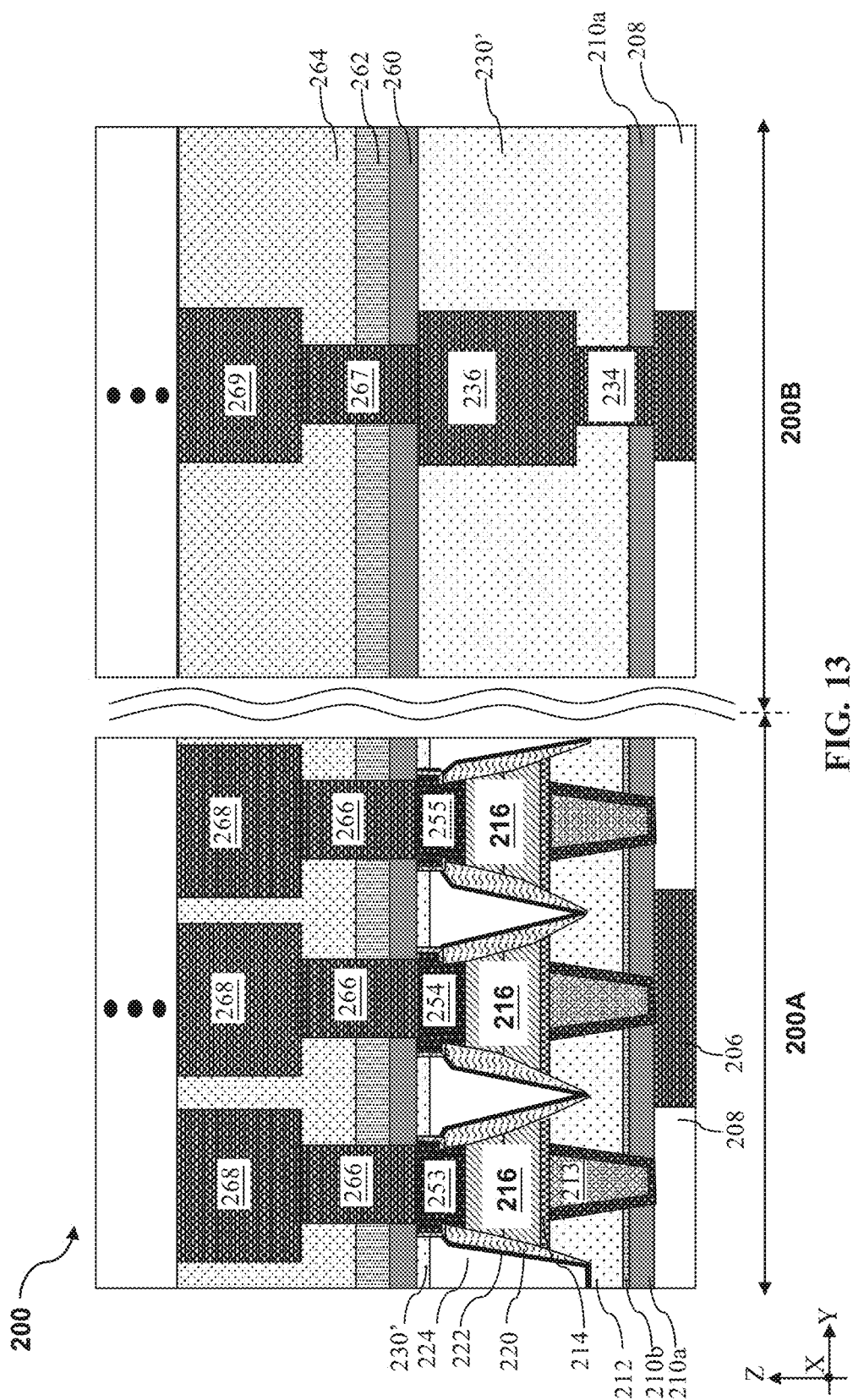
Figure 14:
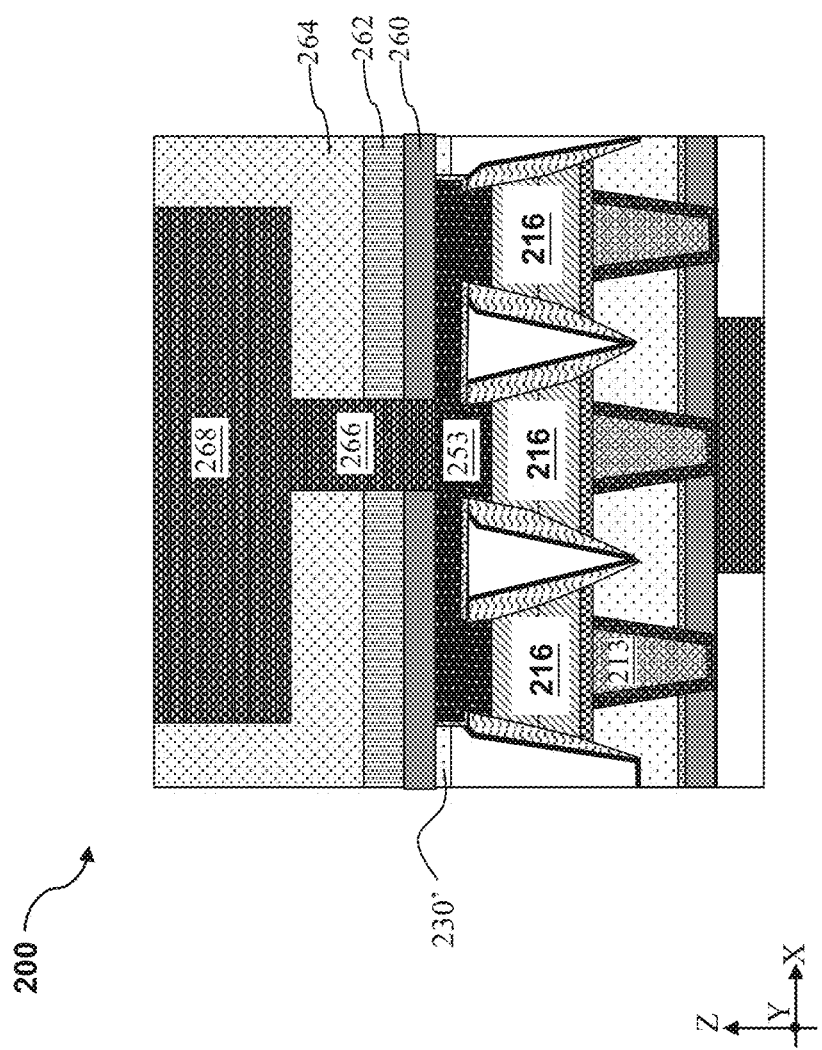

Referring to FIGS. 1 and 13-14, method 100 includes a block 120 where an etch stop layer 260 and conductive features 266-269 are formed over the workpiece 200, including over the MRAM region 200A and the logic region 200B. In embodiments represented in FIG. 13, the etch stop layer 260 is formed directly on the common top electrodes 253-255 and the conductive lines 235. That is, the common top electrodes 253-255 and the conductive lines 236 are all disposed under the etch stop layer 260. Top surfaces of the common top electrodes 253-255 and the conductive lines 236 are in direct contact with the bottom surface of the etch stop layer 260. Since the operations in block 118 provides a planar top surface 256t extending across the MRAM region 200A and the logic region 200B, the etch stop layer 260 includes a substantial planar bottom surface extending along the workpiece 200. In some embodiments, the etch stop layer 260 may include one or more dielectric materials such as silicon nitride, silicon oxynitride, silicon carbide, silicon carbonitride, a combination thereof, or other suitable materials. In some embodiments, a thickness of the etch stop layer 260 may be between about 10 nm and 15 nm to facilitate the formation of satisfactory contact vias 266 and 267. In some embodiments, a ratio of the thickness T3 of the common top electrode 253 to the thickness of the etch stop layer 260 may be between about 1 and about 2 to facilitate the formation of satisfactory common top electrodes 253-255 while ensuring that the etch stop layer 260 would provide a satisfactory protection for the features disposed under the etch stop layer 260 during the formation of features such as contact vias 266-267.

After the formation of the etch stop layer 260, a dielectric layer 262 is formed over the etch stop layer 260, including over the MRAM region 200A and the logic region 200B, to facilitate the subsequent photolithography employed in forming features such as contact vias 266-267 (shown in FIG. 13). In an embodiment, the dielectric layer 262 includes tetraethylorthosilicate (TEOS) oxide. The dielectric layer 262 may have a thickness substantially equal to or smaller than the thickness of the etch stop layer 260. In some embodiments, the thickness of the dielectric layer 262 may be between about 5 nm and about 20 nm to provide a satisfactory adhesion between the to-be-formed low-k dielectric layer 264 and the etch stop layer 260 without significantly affecting the dimension of the final structure. A low-k dielectric layer 264 is then formed on the dielectric layer 262. The dielectric layer 262 and the low-k dielectric layer 264 may include one or more oxide based dielectric materials such as silicon dioxide, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials, and may be deposited using CVD, PVD, or other suitable methods.

Contact vias 266 may be formed over and electrically coupled to the common top electrodes 253-255 in the MRAM region 200A, and contact vias 267 may be formed over and electrically coupled to the conductive lines 236 in the logic region 200B. Since the workpiece 200 includes a planar top surface extending across both the MRAM region 200A and the logic region 200B, the contact vias 266 in the MRAM region 200A and the contact vias 267 in the logic region 200B may be formed simultaneously and have a substantially same height. More specifically, the top surfaces and bottom surfaces of contact vias 266 are coplanar with top surfaces and bottom surfaces of the contact vias 267, respectively. In an embodiment, a width W of the contact via 266 (along the Y direction) is between about 50 nm and about 70 nm such that methods for forming features over the contact via 266 would be readily integrated into existing semiconductor fabrication processes. Conductive lines 268 may be formed over and electrically coupled to the contact vias 266 in the MRAM region 200A, and conductive lines 269 may be formed over and electrically coupled to the contact vias 267 in the logic region 200B. The conductive lines 268 and the conductive lines 269 may be formed simultaneously and have a substantially same height. More specifically, the top surfaces of the conductive line 268 are coplanar with top surfaces of the conductive lines 269, and the bottom surfaces of the conductive line 268 are coplanar with bottom surfaces of the conductive lines 269. The contact vias 266, 267 and the conductive lines 268, 269 each may include a barrier layer including tantalum, tantalum nitride, titanium, titanium nitride, or other suitable materials and a conductive fill layer such as copper, aluminum, or other suitable materials formed over the barrier layer. FIG. 14 depicts a fragmentary cross-sectional view of the workpiece 200 along the X direction. As shown in FIG. 14, the conductive line 238 is electrically coupled to three MTJs in the X direction by way of the contact via 266 and the common top electrode 253.

Figure 15:
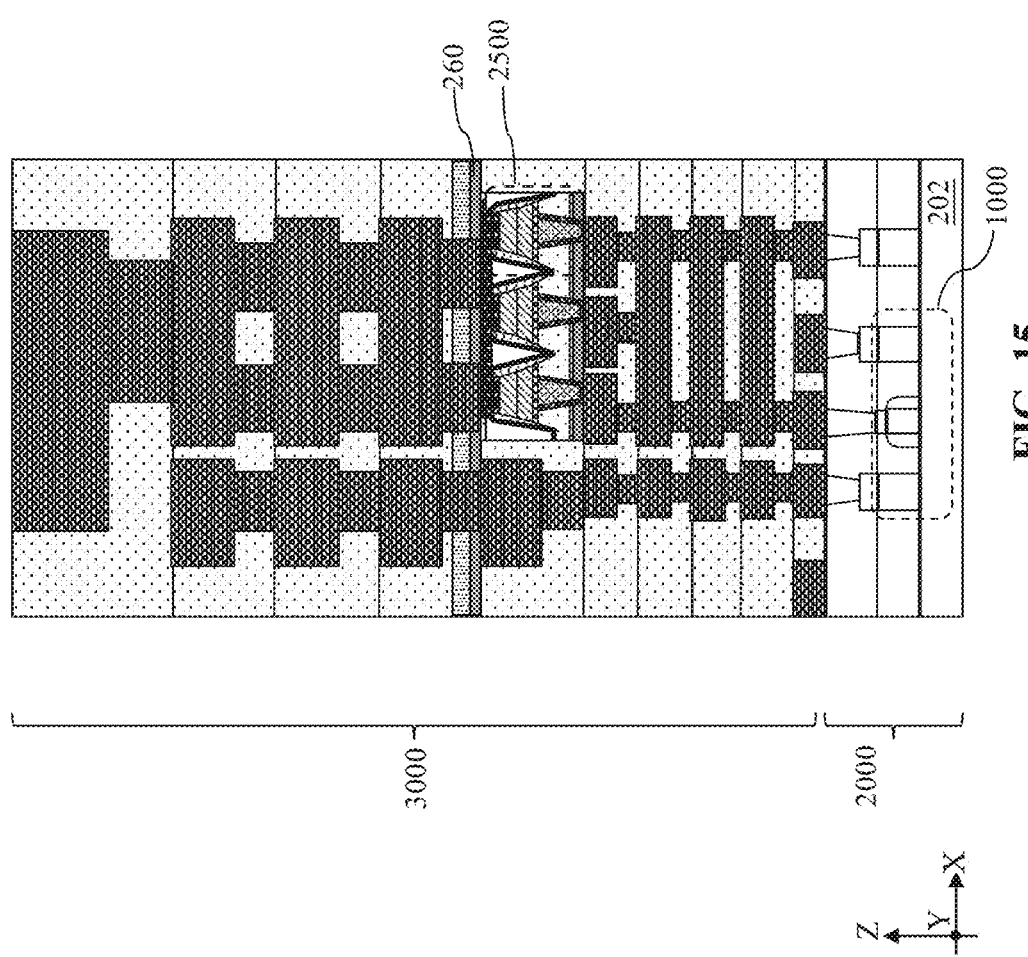

Referring to FIGS. 1 and 15, method 100 includes a block 122 where further processes are performed. Such further processes may include planarization of the workpiece 200 and formation of further interconnect layers over the low-k dielectric layer 264. As shown in FIG. 15, upon conclusion of operations at block 122, the interconnect structure 3000 may include more than 9 interconnect layers, such as between 9 interconnect layers and 14 interconnect layers. Each of the further interconnect layers includes contact vias and conductive lines embedded in an intermetal dielectric layer.

Although not intended to be limiting, one or more embodiments of the present disclosure provide many benefits to a semiconductor structure and the formation thereof. For example, embodiments of the present disclosure form an MRAM array and logic devices integrated in the same device. By controlling the end points of the first planarization process and the second planarization process, without using a photolithography process to cover the MRAM region and performing one or more etching processes to remove excessive materials in the logic region, a satisfactory common top electrode may be formed, and the conductive features (e.g., conductive lines, contact vias) over the common top electrodes may be formed simultaneously in the MRAM region and the logic region. Thus, the fabrication process of forming the semiconductor structure is simplified, thereby reducing fabrication cost and improving yield. Furthermore, embodiments of the present disclosure can be readily integrated into existing semiconductor fabrication processes.

The present disclosure provides for many different embodiments. Semiconductor structures and methods of fabrication thereof are disclosed herein. In one exemplary aspect, the present disclosure is directed to a method. The method includes receiving a workpiece comprising a magnetic tunneling junction (MTJ) and a conductive capping layer disposed on the MTJ, depositing a first dielectric layer over the workpiece, performing a first planarization process to the first dielectric layer, after the performing of the first planarization process, patterning the first dielectric layer to form an opening exposing a top surface of the conductive capping layer, selectively removing the conductive capping layer, depositing an electrode layer to fill the opening, and performing a second planarization process such that a top surface of the electrode layer and a top surface of the first dielectric layer are coplanar.

In some embodiments, the performing of the second planarization process may remove an excessive portion of the electrode layer and an excessive portion of the first dielectric layer. In some embodiments, the method may also include depositing a first etch stop layer over the workpiece after the performing of the first planarization process, depositing a second dielectric layer over the first etch stop layer, and forming a patterned hard mask layer over the second dielectric layer. The patterning of the first dielectric layer may include performing a first etching process to etch the second dielectric layer, the first etch stop layer, and the first dielectric layer using the patterned hard mask layer as an etch mask.

In some embodiments, the performing of the second planarization process may remove the second dielectric layer and the first etch stop layer. In some embodiments, the performing of the first planarization process may provide a first planarized top surface, and a distance between the first planarized top surface and the top surface of the conductive capping layer may be greater than a thickness of the first etch stop layer. In some embodiments, the method may also include forming a second etch stop layer over the first etch stop layer before the depositing of the second dielectric layer. The second etch stop layer may be more etch-resistant than the first etch stop layer with respect to the first etching process.

In some embodiments, the second etch stop layer may include aluminum oxide. In some embodiments, the method may also include after the performing of the second planarization process, forming an etch stop layer over the workpiece. The etch stop layer may be over and in direct contact with the top surface of the electrode layer. In some embodiments, the conductive capping layer may include titanium nitride. In some embodiments, the depositing of the electrode layer may include forming a conformal liner layer over the workpiece, etching back a portion of the conformal liner layer to expose a top surface of the MTJ, and forming a conductive filler layer to fill the opening.

In another exemplary aspect, the present disclosure is directed to a method. The method includes providing a workpiece comprising a memory region and a logic region, the memory region comprising a first memory cell and a second memory cell disposed in a first dielectric layer, the logic region comprising a conductive feature extending through an upper portion of the first dielectric layer, performing an etching process to selectively remove a conductive capping layer of the first memory cell and a conductive capping layer of the second memory cell to form a trench, forming a common electrode layer in the trench, and planarizing the workpiece to expose the first dielectric layer and form a planarized top surface, the planarized top surface comprising a top surface of the common electrode layer, a top surface of the conductive feature, and a top surface of the first dielectric layer.

In some embodiments, the method may also include depositing an etch stop layer over the planarized top surface, forming a second dielectric layer over the etch stop layer, simultaneously forming a first contact via and a second contact via extending through the etch stop layer and electrically coupled to the common electrode layer and the conductive feature, respectively, and simultaneously forming a first metal line and a second metal line in the second dielectric layer and electrically coupled to the first contact via and the second contact via, respectively.

In some embodiments, a height of the first contact via may be equal to a height of the second contact via. In some embodiments, a total height of the first contact via and the first metal line may be equal to a total height of the second contact via and the second metal line.

In some embodiments, the method may also include forming an etch stop layer over the first dielectric layer before the performing of the etching process and depositing a second dielectric layer over the etch stop layer. The planarizing of the workpiece may remove the second dielectric layer, the etch stop layer and a portion of the first dielectric layer. In some embodiments, the common electrode layer may include copper.

In yet another exemplary aspect, the present disclosure is directed to a semiconductor structure. The semiconductor structure includes a cell region. The cell region includes a first dielectric layer, a plurality of magnetic tunneling junctions (MTJs) disposed in the first dielectric layer, a common top electrode electrically coupled to at least two MTJs of the plurality of MTJs, a top surface of the common top electrode is coplanar with a top surface of the first dielectric layer, and an etch stop layer disposed directly on the first dielectric layer and over the common top electrode.

In some embodiments, the semiconductor structure may also include a logic region. The logic region includes a second dielectric layer a first metal line disposed in the second dielectric layer. A top surface of the second dielectric layer may be coplanar with the top surface of the first dielectric layer. In some embodiments, a top surface of the first metal line may be coplanar with the top surface of the common top electrode.

In some embodiments, the cell region may also include a second contact via disposed over and electrically connected to the common top electrode, and a second metal line disposed over and electrically connected to the second contact via. The logic region may include a third contact via disposed over and electrically connected to the first metal line, and a third metal line disposed over and electrically connected to the third contact via. A total height of the second contact via and the second metal line may be equal to a total height of the third contact via and the third metal line. In some embodiments, the etch stop layer may include a planar top surface that extends across an interface between the cell region and the logic region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a workpiece comprising a magnetic tunneling junction (MTJ) and a conductive capping layer disposed on the MTJ;
depositing a first dielectric layer over the workpiece;
performing a first planarization process to the first dielectric layer;
after the performing of the first planarization process, patterning the first dielectric layer to form an opening exposing a top surface of the conductive capping layer;
selectively removing the conductive capping layer;
depositing an electrode layer to fill the opening; and
performing a second planarization process such that a top surface of the electrode layer and a top surface of the first dielectric layer are coplanar.

2. The method of claim 1, wherein the performing of the second planarization process removes an excessive portion of the electrode layer and an excessive portion of the first dielectric layer.

3. The method of claim 1, further comprising:
after the performing of the first planarization process, depositing a first etch stop layer over the workpiece;
depositing a second dielectric layer over the first etch stop layer; and
forming a patterned hard mask layer over the second dielectric layer,
wherein the patterning of the first dielectric layer comprises performing a first etching process to etch the second dielectric layer, the first etch stop layer, and the first dielectric layer using the patterned hard mask layer as an etch mask.

4. The method of claim 3, wherein the performing of the second planarization process removes the second dielectric layer and the first etch stop layer.

5. The method of claim 3, wherein the performing of the first planarization process provides a first planarized top surface, and a distance between the first planarized top surface and the top surface of the conductive capping layer is greater than a thickness of the first etch stop layer.

6. The method of claim 3, further comprising:
before the depositing of the second dielectric layer, forming a second etch stop layer over the first etch stop layer,
wherein the second etch stop layer is more etch-resistant than the first etch stop layer with respect to the first etching process.

7. The method of claim 6, wherein the second etch stop layer comprises aluminum oxide.

8. The method of claim 1, further comprising:
after the performing of the second planarization process, forming an etch stop layer over the workpiece,
wherein the etch stop layer is over and in direct contact with the top surface of the electrode layer.

9. The method of claim 1, wherein the conductive capping layer comprises titanium nitride.

10. The method of claim 1, wherein the depositing of the electrode layer comprises:
forming a conformal liner layer over the workpiece;
etching back a portion of the conformal liner layer to expose a top surface of the MTJ; and
forming a conductive filler layer to fill the opening.

11. A method, comprising:
providing a workpiece comprising a memory region and a logic region, the memory region comprising a first memory cell and a second memory cell disposed in a first dielectric layer, the logic region comprising a conductive feature extending through an upper portion of the first dielectric layer;
performing an etching process to selectively remove a conductive capping layer of the first memory cell and a conductive capping layer of the second memory cell to form a trench;
forming a common electrode layer in the trench; and
planarizing the workpiece to expose the first dielectric layer and form a planarized top surface, the planarized top surface comprising a top surface of the common electrode layer, a top surface of the conductive feature, and a top surface of the first dielectric layer.

12. The method of claim 11, further comprising:
depositing an etch stop layer over the planarized top surface;
forming a second dielectric layer over the etch stop layer;
simultaneously forming a first contact via and a second contact via extending through the etch stop layer and electrically coupled to the common electrode layer and the conductive feature, respectively; and
simultaneously forming a first metal line and a second metal line in the second dielectric layer and electrically coupled to the first contact via and the second contact via, respectively.

13. The method of claim 12, wherein a height of the first contact via is equal to a height of the second contact via.

14. The method of claim 12, wherein a total height of the first contact via and the first metal line is equal to a total height of the second contact via and the second metal line.

15. The method of claim 11, further comprising:
before the performing of the etching process, forming an etch stop layer over the first dielectric layer; and
depositing a second dielectric layer over the etch stop layer,
wherein the planarizing of the workpiece removes the second dielectric layer, the etch stop layer and a portion of the first dielectric layer.

16. The method of claim 11, wherein the common electrode layer comprises copper (Cu).

17. A method, comprising:
receiving a workpiece comprising a magnetic tunneling junction (MTJ) and a dummy layer on the MTJ;
depositing a first dielectric layer over the workpiece and on the dummy layer;
performing a first planarization process to the first dielectric layer, wherein a top surface of the planarized first dielectric layer is above a top surface of the dummy layer;
forming an etch stop layer on the planarized first dielectric layer;
patterning the etch stop layer and the planarized first dielectric layer to form an opening exposing the dummy layer;
selectively removing the dummy layer to vertically extend the opening;
forming a conducive material in the vertically extended opening; and
performing a second planarization process to the workpiece to remove the etch stop layer, a portion of the planarized first dielectric layer, and a portion of the conducive material thereover.

18. The method of claim 17, wherein the MTJ is formed in a memory region of the workpiece, the workpiece further comprises a logic region, and the depositing of the first dielectric layer comprises depositing a first portion of the first dielectric layer in the memory region and a second portion of the first dielectric layer in the logic region, wherein the method further comprises:

after the performing of the first planarization process and before the forming of the etch stop layer, forming a conductive feature in the logic region, a top surface of the conductive feature is coplanar with the top surface of the planarized first dielectric layer.

19. The method of claim 18, wherein the performing of the second planarization process further reduces a height of the conductive feature.

20. The method of claim 18, further comprising:

after the performing of the second planarization process, simultaneously forming a first interconnect layer in the memory region and a second interconnect layer in the logic region, a height of a via in the first interconnect layer is substantially equal to a height of a via in the second interconnect layer.

* * * * *